US008698540B2

(12) United States Patent
Morong

(10) Patent No.: US 8,698,540 B2
(45) Date of Patent: Apr. 15, 2014

(54) DC COMMON MODE LEVEL SHIFTER

(75) Inventor: William H. Morong, Norristown, PA (US)

(73) Assignee: CogniPower, LLC, Malvern, PA (US)

( * ) Notice: Subject to any disclaimer, the term of this patent is extended or adjusted under 35 U.S.C. 154(b) by 0 days.

(21) Appl. No.: 12/361,074

(22) Filed: Jan. 28, 2009

(65) Prior Publication Data

US 2009/0251194 A1   Oct. 8, 2009

Related U.S. Application Data

(60) Provisional application No. 61/042,106, filed on Apr. 3, 2008.

(51) Int. Cl.
*H03L 5/00*   (2006.01)

(52) U.S. Cl.
USPC ................................ 327/333; 326/61; 326/80

(58) Field of Classification Search
USPC .................. 326/62–63, 80–81; 327/306, 333; 363/20
See application file for complete search history.

(56) References Cited

U.S. PATENT DOCUMENTS

| | | | |
|---|---|---|---|
| 3,652,949 A | 3/1972 | Szabo | |
| 3,824,407 A | 7/1974 | Risbert | |
| 4,482,862 A | 11/1984 | Leehey | |
| 5,498,991 A | 3/1996 | Tanoi | |
| 7,180,759 B2 * | 2/2007 | Liptak et al. | ................ 363/56.08 |
| 2002/0131283 A1 | 9/2002 | Preller | |
| 2005/0134389 A1 | 6/2005 | Scherrer et al. | |
| 2011/0122657 A1 * | 5/2011 | Lawson et al. | ................... 363/20 |

OTHER PUBLICATIONS

International Searching Authority, International Search Report, Mar. 11, 2009.

* cited by examiner

*Primary Examiner* — Dinh T. Le
(74) *Attorney, Agent, or Firm* — Mendelsohn, Drucker & Dunleavy, P.C.; Steve Mendelsohn

(57) ABSTRACT

A switched-mode level-shifter shifts a differential voltage superimposed on a common-mode voltage. In the level shifter, a common-mode inductive reactor has at least two windings, and at least one of the differential voltage and the common-mode voltage are applied to at least one of the windings of the reactor. A switch charges the inductive reactor when caused to be in a first state, where the inductive reactor when charged experiences a change of flux according to the applied voltage. The switch also actuates a reset of the charged inductive reactor when caused to be in a second state, where the inductive reactor when reset reverses the change of flux experienced thereby. A source of a chopping signal is provided to alternately drive the switch between the first and second states, where each of the first and second states is one of in and out of conduction.

16 Claims, 12 Drawing Sheets

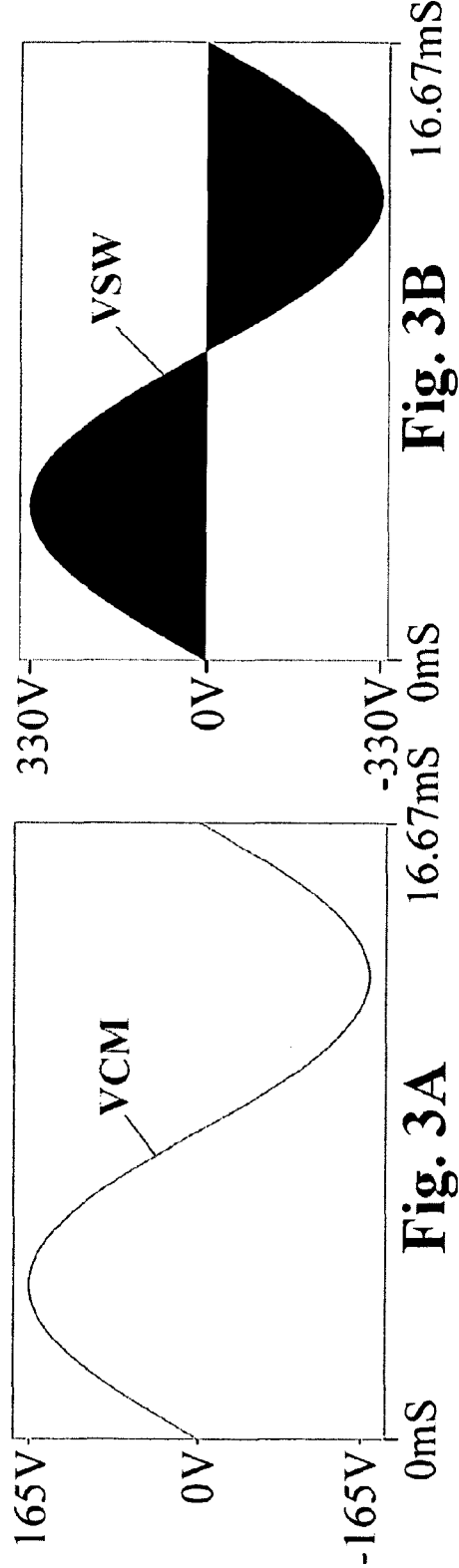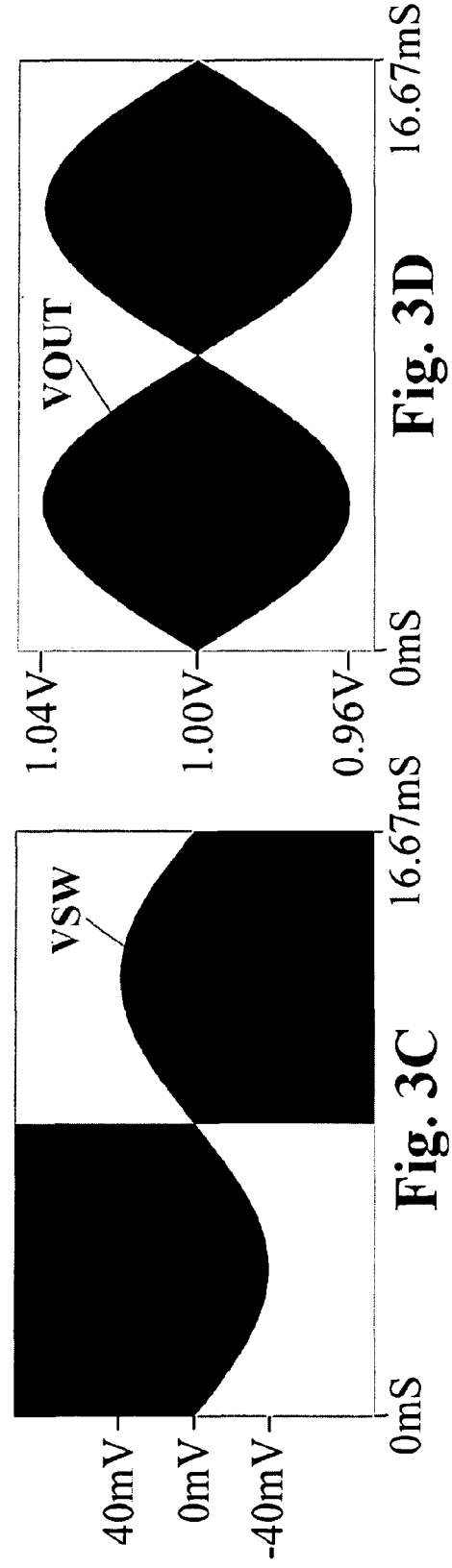

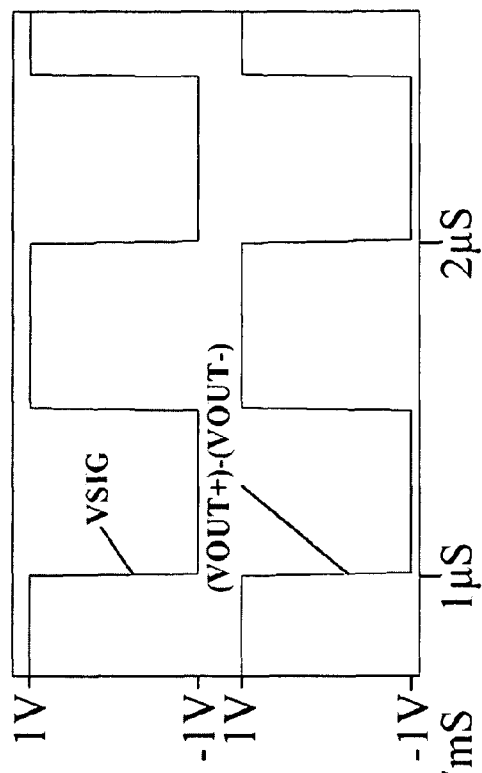
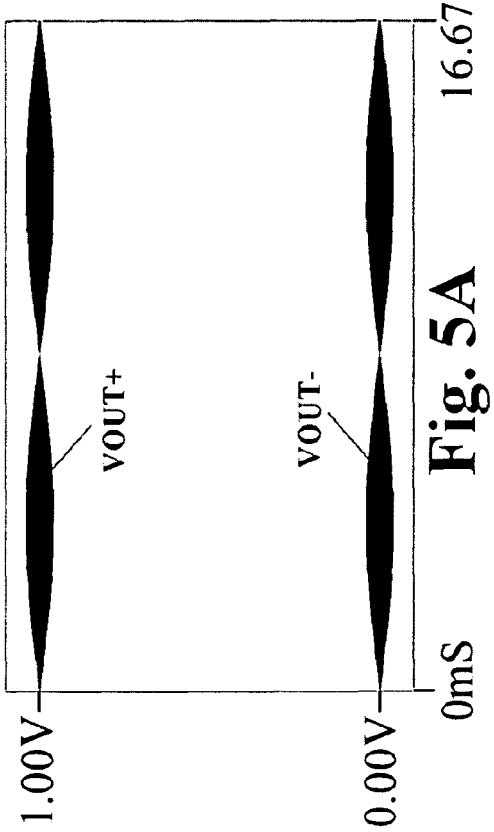
Fig. 5A
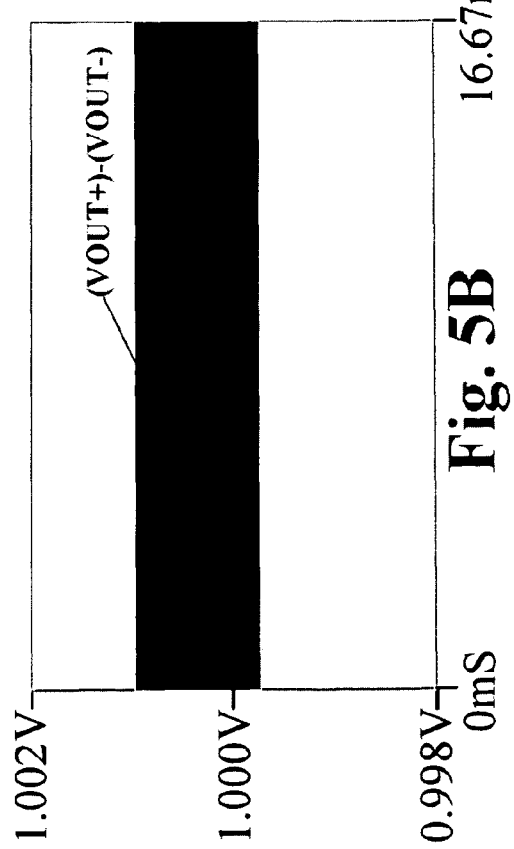
Fig. 5B
Fig. 5C

DC COMMON MODE LEVEL SHIFTER

CROSS-REFERENCE TO RELATED APPLICATIONS

The present application claims the benefit of U.S. Provisional Application No. 61/042,106 filed on Apr. 2, 1008, which is incorporated herein by reference.

STATEMENT REGARDING FEDERALLY SPONSORED RESEARCH OR DEVELOPMENT

The present invention was not developed with the use of any Federal Funds, but was developed independently by the inventors.

FIELD

The present disclosure is directed to a common-mode level shifter capable of shifting wideband DC differential signals across large AC or DC common-mode voltage differences with exceptional fidelity, even in the presence of common-mode transients. The present disclosure in particular is directed to a sampling bridge that faithfully acquires signals in the presence of severe common-mode disturbances.

BACKGROUND

In the prior art it is known that a differential voltage transformer may be employed, where an AC voltage signal is applied across the primary windings thereof and induces an equal voltage per turn across the secondary or coupled windings thereof. With ideal coupling, the voltage per turn from winding to winding is exceedingly well matched. This property gives rise to a less understood but widely used transformer application: the common-mode choke. In the common-mode choke, a differential pair of signals is applied to two same-phased poles of two windings to have their circuit completed through two oppositely-phased poles of the same two windings. If coupling between windings is perfect, the magnetic flux of one winding perfectly cancels that of the other, and the common-mode choke introduces no inductance whatsoever to the circuit. However, any voltage applied to one set of like-phased poles with respect to their oppositely-phased pair appears therebetween, with the result being that both windings drop precisely the same voltage in precisely the same phase. Thus, a common-mode choke can AC level-shift a differential AC or DC signal, as is known. As is also known, a common-mode choke is not limited to two windings but instead may be made with many windings to AC level-shift many circuits.

Though differential currents generate in the common-mode choke no flux, the same is not true of common-mode currents. Any common-mode voltage causes inductive common-mode current flow through the common-mode choke as it would in any inductor. As common-mode frequency approaches zero, and as inductive reactance disappears, inductive voltage drop across any winding proportionally vanishes and the common-mode choke becomes inutile as a level shifter. A DC common-mode voltage may cause a large common-mode current, and may saturate any common-mode choke core rendering it inoperative for AC as well.

Accordingly, a need exists for a method and mechanism to avoid saturating a common-mode choke core when a DC common-mode voltage is applied thereto. Moreover, a need exists for such a method and mechanism where a common-mode level shifter can shift wideband DC differential signals across large AC or DC common-mode voltage differences with exceptional fidelity, even in the presence of common-mode transients, and where a sampling bridge faithfully acquires signals in the presence of severe common-mode disturbances.

SUMMARY

According to the present disclosure, rather than applying a low-frequency or DC common-mode voltage directly to a common-mode choke, the common-mode voltage is switched or commutated to allow the flux of the common-mode choke to be reset before excessive inductive current can flow. With flux reset, then, the common-mode choke can level shift differential signals even from one DC common-mode voltage to another DC common-mode voltage.

Thus, the aforementioned needs are satisfied at least in part by a switched-mode level-shifter that shifts a differential voltage superimposed on a common-mode voltage. In the level shifter, a common-mode inductive reactor has at least two windings, and at least one of the differential voltage and the common-mode voltage are applied to at least one of the windings of the reactor. A switch charges the inductive reactor when caused to be in a first state, where the inductive reactor when charged experiences a change of flux according to the applied voltage. The switch also actuates a reset of the charged inductive reactor when caused to be in a second state, where the inductive reactor when reset reverses the change of flux experienced thereby. A source of a chopping signal is provided to alternately drive the switch between the first and second states, where each of the first and second states is one of in and out of conduction.

BRIEF DESCRIPTION OF THE DRAWINGS

The foregoing summary, as well as the following detailed description of various embodiments of the present innovation, will be better understood when read in conjunction with the appended drawings. For the purpose of illustrating the embodiments, there are shown in the drawings embodiments which are presently envisioned. As should be understood, however, the embodiments of the present innovation are not limited to the precise arrangements and instrumentalities shown. In the drawings:

FIGS. 3A-3D are timing diagrams associated with the choke of FIG. 2;

FIGS. 5A-5C are timing diagrams associated with the choke of FIG. 4;

DETAILED DESCRIPTION

Rejection of common mode voltages is necessary for the proper functioning of any differential amplifier. Only at lower voltages and frequencies can solid state differential amplifiers excel at common mode rejection (CMR). Among the limiting factors for CMR is the voltage range that such amplifiers can withstand, typically less than 30 volts. In order to accommodate larger voltages, resistive dividers are generally employed to reduce the input signals to within the amplifiers' acceptable voltage range. Such dividers must be matched for both DC and AC response to avoid the degradation of CMR with increasing frequency. In practice, such divider-amplifier combinations are of little utility for higher voltage, higher frequency applications. The innovation set forth herein differentially level-shifts a voltage to near ground potential with good AC and DC precision. That shifted signal can then be sensed using a conventional differential amplifier resulting in exceptional accuracy and bandwidth.

Figure 1:
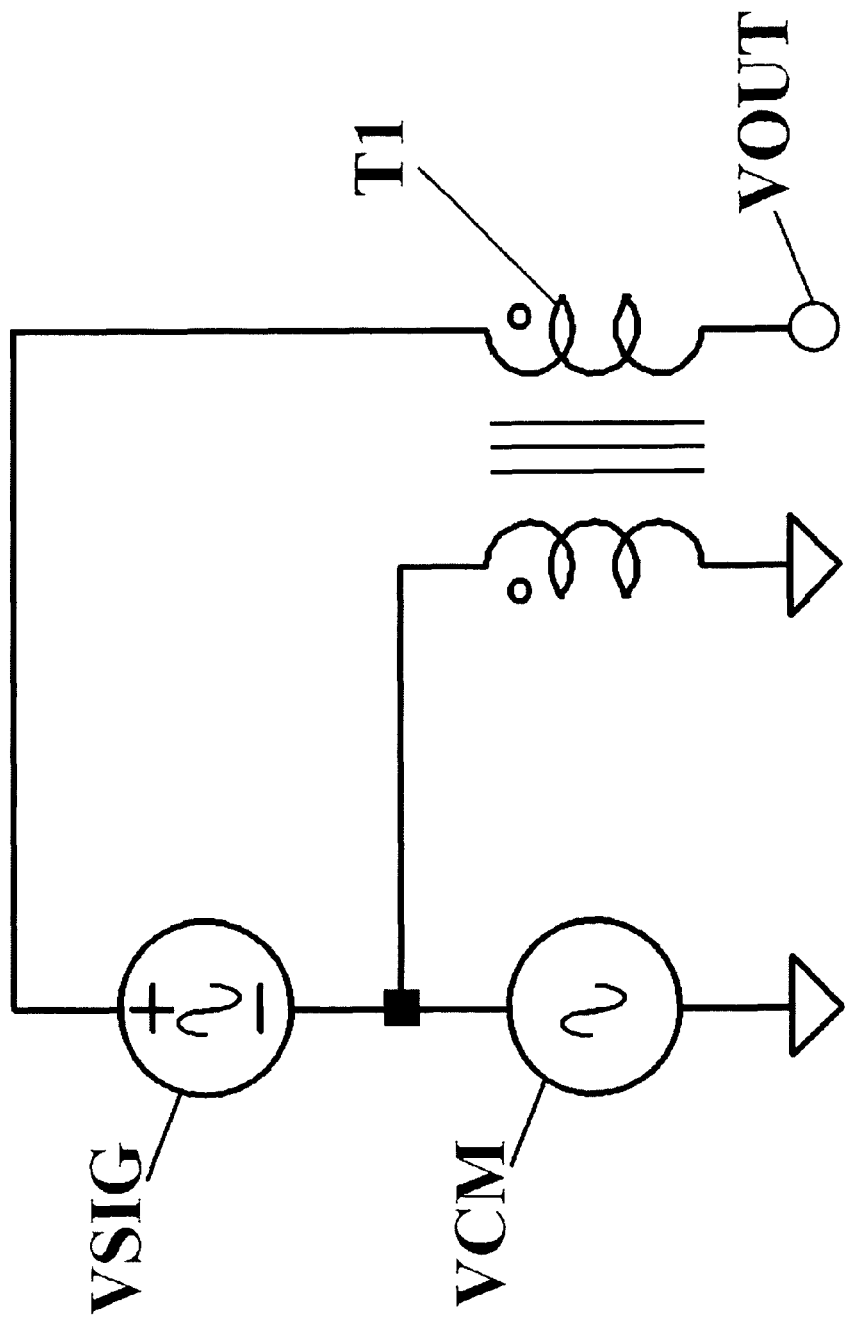
FIG. 1 is a schematic diagram of a prior art application in which a common-mode choke shifts a differential signal to near-ground.

Turning now to FIG. 1, a prior-art application is shown in which a common-mode choke T1 shifts a differential signal VSIG from what should be presumed to be a relatively high AC common-mode voltage VCM to near-ground. A typical application might involve a relatively small VSIG being developed across a fractional-ohm sense resistor. As seen, VSIG appears across two same-phased poles of the two windings of T1 and VCM appears across two oppositely-phased poles of the same two windings of T1. As was noted above, if coupling between the windings of T1 is perfect, the magnetic flux of one winding perfectly cancels that of the other, and T1 introduces no inductance whatsoever to the circuit. However, any voltage applied to one set of like-phased poles with respect to their oppositely-phased pair appears therebetween, with the result being that both windings drop precisely the same voltage in precisely the same phase. Thus, T1 AC level-shifts VSIG to appear at VOUT as near-ground and without VCM.

As should be appreciated, to implement the prior art application of FIG. 1 with VCM being 117V RMS at 60 Hz, without unreasonable currents, a large iron-core transformer with an inductance of one Henry or more might be required. VCM is shown as an AC-only source because a DC VCM would cause a large current in T1. As was alluded to above, such a large common-mode current would saturate any common-mode choke core, thereby rendering the core inoperative for AC as well. In high voltage or high power or high speed circuitry it can be desirable to determine VSIG with precision even in the presence of the fast-changing AC or the large DC common mode voltages that are often associated with such circuits.

Figure 2:
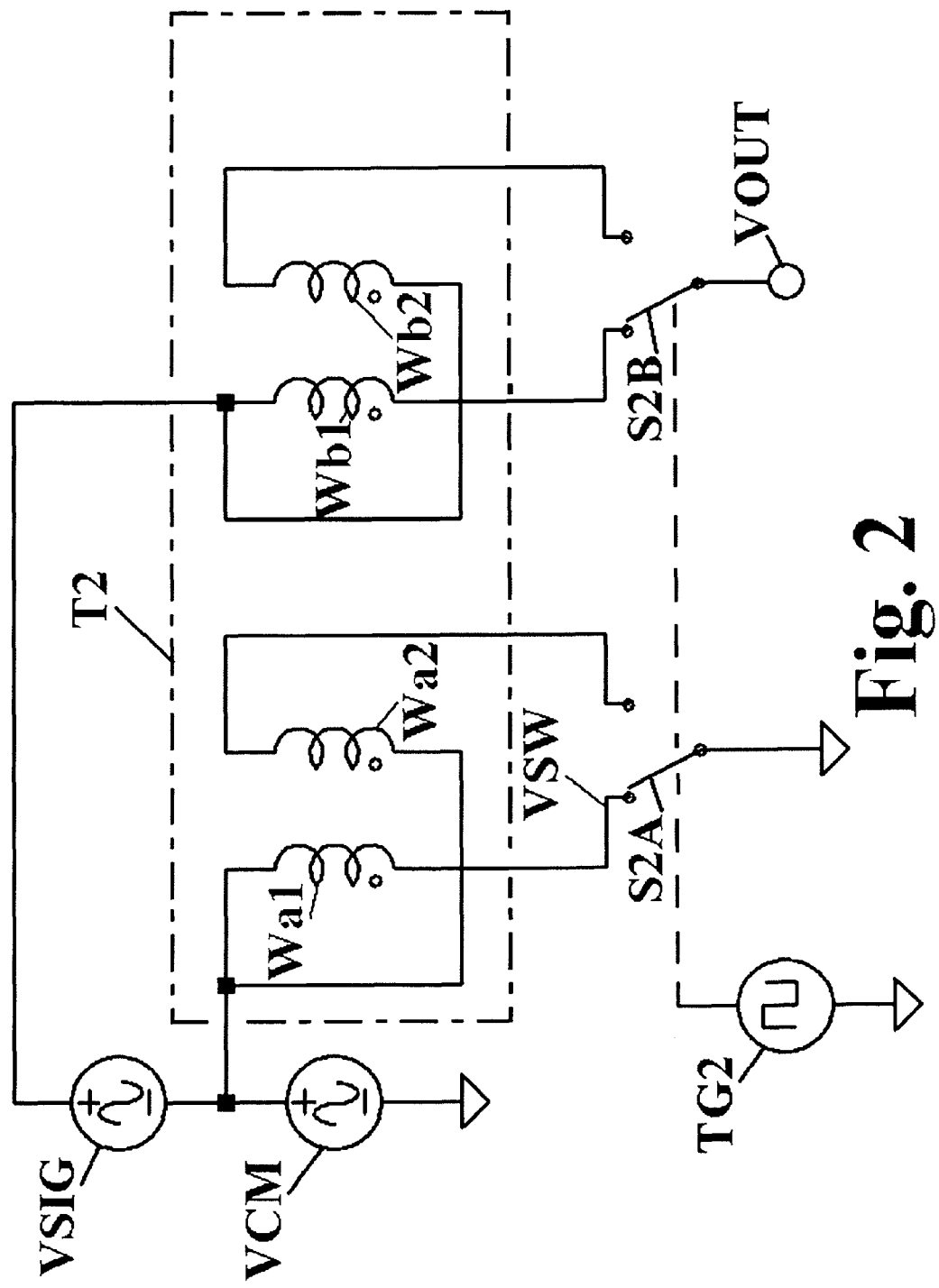
FIG. 2 is a schematic diagram of a commutated common-mode choke in accordance with one embodiment of the present innovation.

FIG. 2 shows a commutated common-mode choke T2 according to one embodiment of the present innovation. As seen, T2 has windings Wa1, Wa2 and Wb1, Wb2, each of which corresponds to a winding of T1 in FIG. 1, and has been implemented as a center-tapped winding. Responsive to a chopping signal TG2, perhaps having a duty-cycle of about 50%, SPDT switch S2A first energizes winding Wa1 by way of VCM, causing the current therein to ramp up. When TG2 toggles, S2A switches to energize Wa2 by way of VCM in a direction opposite connect its other pole and Wa2. Until the magnetic field of T2 reaches zero, Wa2 induces a negative current through S2A, after which current in S2A ramps positive until the next toggling of TG2. Then, decaying negative current will flow in the first pole of S2A, followed by a positive ramp as at the first. The operation of S2B, Wb1 and Wb2 is identical save that the magnetizing voltage may differ by VSIG.

The voltage VSW at the dot side of Wa1 is slightly negative during the current decay in the first pole of S2A, ramping slightly positive once the current ramp crosses zero. When TG2 toggles, VSW flies positive to approximately twice the present value of VCM. TG2 commutates switch S2B in synchrony with S2A, causing synchronous rectification of the voltages induced into Wb1 and Wb2.

The finite resistance of S2A and of T2 causes the voltage applied to windings Wa1 and Wa2, and the voltage induced into windings Wb1 and Wb2, to be slightly less than VCM. Were S2A, S2B, and T2 ideal, VOUT would be a perfect ground-referred replica of VSIG. However, non-idealities of these parts causes carrier feed-through from TG2 to appear as AC ripple superimposed upon the replica of VSIG appearing at VOUT.

It should be noted that VSIG may be either AC or DC. VCM may be AC if the S2A and S2B are bipolar-blocking, but if unipolar-blocking, VCM is to be restricted to the polarity blocked. It should also be noted that commutation as applied to T2 by way of TG2, S2A, and S2B in effect resets T2 should T2 experience saturation.

Thus, the embodiment shown in FIG. 2 addresses resetting a choke should saturation occur in connection therewith. Nevertheless, the embodiment of FIG. 2 is not especially optimal in that the operation of common-mode chokes depends upon magnetic coupling, which may be maximized by multi-filar windings or similar techniques. That said, it is a practical problem that such techniques also maximize electrostatic coupling, increasing capacitances. Center-tapping windings as shown in FIG. 2 exacerbates the problem by placing in close proximity winding turns of differing AC potentials. The energy stored in winding capacitance cannot be destroyed when VCM changes quickly, causing the VCM transient waveforms of any practical circuit to be far more unruly than computer-generated waveforms of the ideally simple circuit of FIG. 2 would suggest.

Turning now to FIGS. 3A-3D, such computer-generated waveforms of the circuit of FIG. 2 are shown. FIG. 3A in particular shows a VCM of about 117 Vrms at 60 Hz. FIG. 3B shows the waveform envelope at VSW resulting from the commutation of the VCM of FIG. 3A, which as was alluded to forth above is approximately twice VCM due to fly-back. Due to the large scale of FIG. 3B, the envelope of the S2A on-voltage is imperceptible. FIG. 3C shows a magnified view of the S2A on-voltage envelope, the curved boundaries of which are defined by the voltage developed across S2A as current in T2 begins to decay. Here, VSIG was set at 1.00 Vdc, and FIG. 3D shows the envelope of the ripple at VOUT superimposed upon the 1.00 Vdc replica of VSIG appearing thereat.

It should be noted that since the drop across S2A is largely responsible for the ripple, the ripple envelope amplitude is approximately equal to the on-voltage envelope of S2A shown in FIG. 3C. As is true of all common-mode chokes, accuracy is greatest when the coupling of T2 is as near unity as possible. It should also be noted that the frequency of TG2 used to generate the waveforms of FIGS. 3A-3D is 100 kHz. Other frequencies for TG2 may be employed, though.

Figure 4:
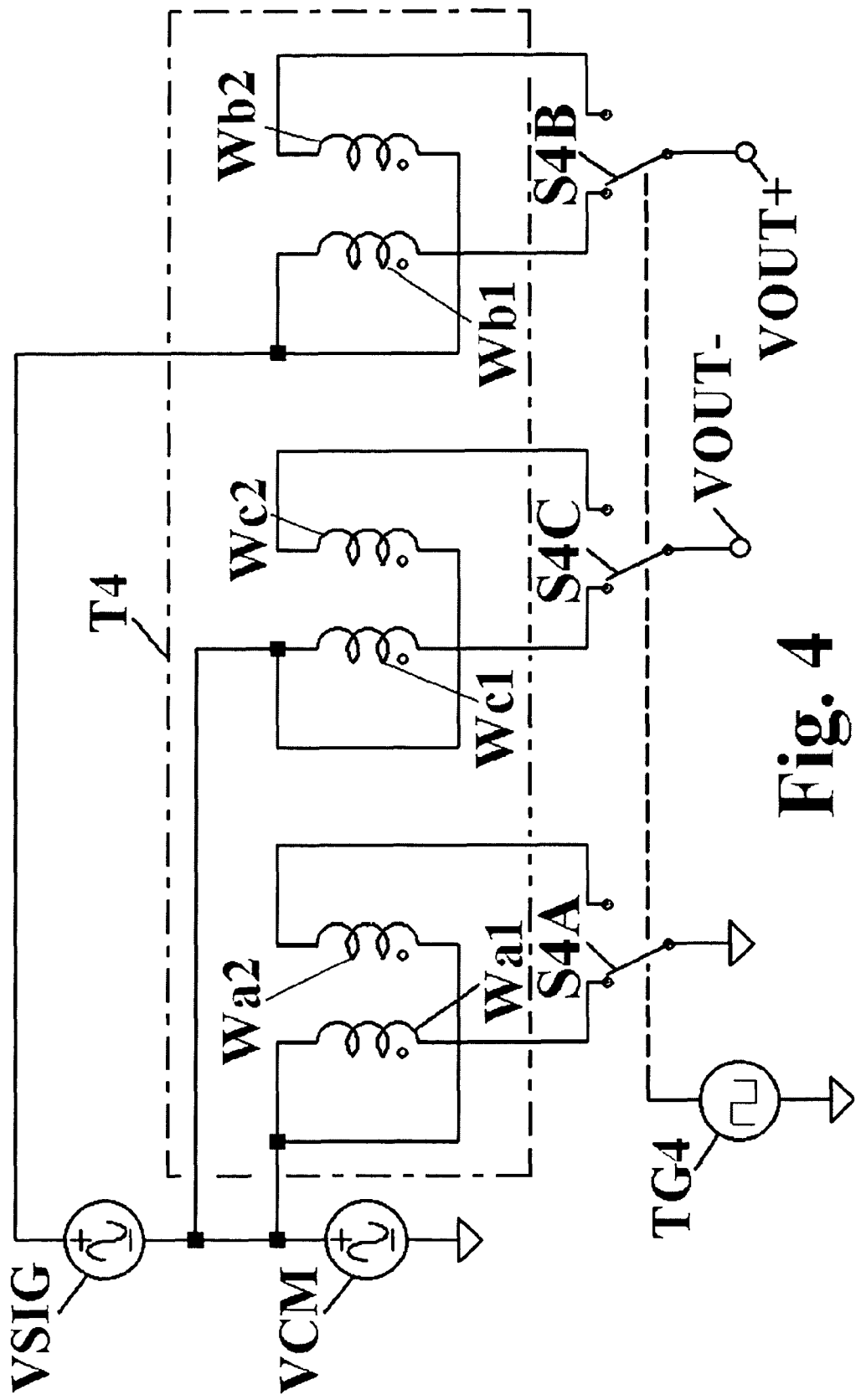
FIG. 4 is a schematic diagram of a commutated common-mode choke in accordance with another embodiment of the present innovation.

Turning now to FIG. 4, it is seen that a commutated common-mode choke in accordance with another embodiment of the present innovation comprises a third center-tapped winding and a third SPDT switch as compared with the choke of FIG. 3. In FIG. 4, S4A and S4B operate precisely as S2A and S2B in FIG. 2. S4C operates analogously to S4B. Just as S4B synchronously rectifies induced voltage to produce at VOUT+ a replica of the voltage at the top of VSIG, S4C produces at VOUT− a replica of the voltage at the junction of VSIG and VCM. As seen, S4A and S4C differ only in that S4A switches to ground while S4C switches to an open terminal at which VOUT− appears.

The voltage at VOUT− approximates that which would be produced were S4C's two switched poles attached in parallel with the corresponding poles of S4A. However since magnetizing current flows in S4A and the corresponding windings Wa1, Wa2, but not in S4B and S4C and the corresponding windings Wb1, Wb2 and Wc1, Wc2, the VOUT+ and VOUT− are substantially equal save the replica of VSIG appearing between them. Thus VOUT+ and VOUT− produce a ground-referred differential representation of VSIG containing a small common-mode ripple and very little differential ripple. It should also be noted that commutation as applied to T4 by way of TG4, S2A, S2B, and S2C in effect resets T2 should T2 experience saturation.

As with the embodiment of FIG. 2, the embodiment shown in FIG. 4 also addresses resetting a choke should saturation occur in connection therewith. Nevertheless, the embodiment of FIG. 4 is not especially optimal, for the same reasons cited above in connection with FIG. 2. As a result, and turning now to FIG. 5A, it is seen that VOUT+ and VOUT− each have ripples, as was the case with VOUT of FIG. 3D. FIG. 5B shows the difference between VOUT+ and VOUT−, which is a substantially ground-referred differential replica of VSIG. FIG. 5C shows the bandwidth and phase fidelity of VSIG and (VOUT+)−(VOUT−) from FIG. 4 in operation. Were VSIG and (VOUT+)−(VOUT−) not separated for clarity in FIG. 5C, it would be difficult to see that they were not one signal. In this case, VSIG is a 1 MHz square wave.

Figure 6:
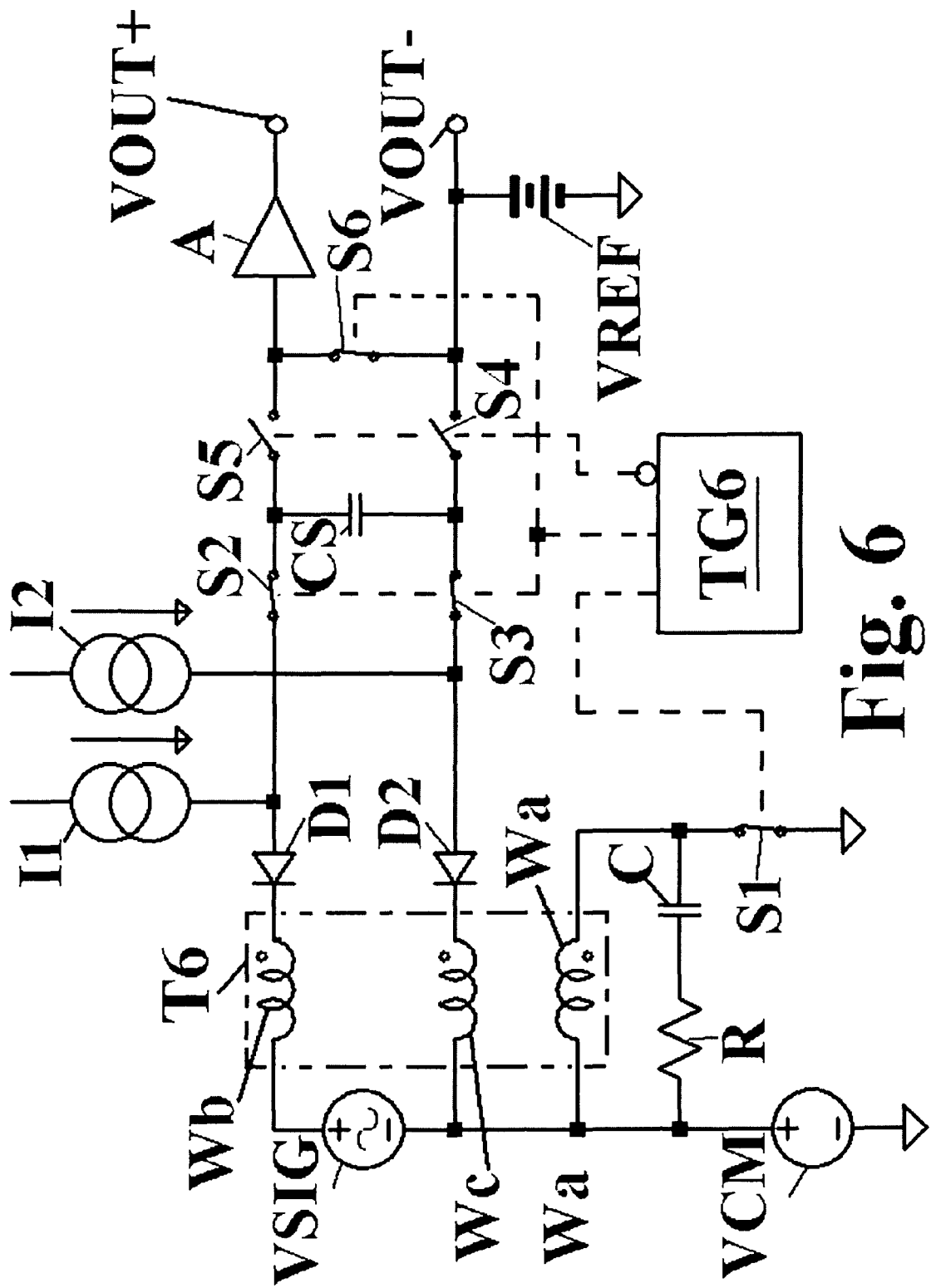
FIG. 6 is a schematic diagram of a dampened resonance common-mode choke in accordance with another embodiment of the present innovation.

FIG. 6 shows another embodiment of the present innovation where T6, generally corresponding to T2 and T4, is reset not by commutation, but by damped resonance. Thus, the circuit of FIG. 6 does not require center-tapped windings as do the circuits of FIGS. 2 and 4. In the circuit of FIG. 6, S1 is turned on by a timing generator, TG6, with a 3.2 MHz square wave of about 25% duty-cycle. The on-behavior of S1 and T6 is analogous to that of corresponding parts of FIGS. 2 and 4. However, when TG6 turns off S1, T6 flies back into capacitance associated with S1 and stray capacitance (such capacitances not being shown in FIG. 6), with T6 acting as the inductor of a low Q resonant circuit. R and C as seen in FIG. 6 represent the resistive and capacitive losses of T6, which may be sufficient to damp same, or else the resistive and capacitive values of an added snubber network.

Windings Wb and Wc of T6 are analogous to those of FIG. 4, but not center-tapped. When S1 is on, currents from I1 and I2 flow through diodes D1 and D2 respectively, turning on both. I1 and I2 are made equal if D1 and D2 are matched; otherwise they are proportioned to equalize diode current densities, resulting in equal diode drops. Thus, during S1 on-time, the voltage between the diode anodes approaches a replica of VSIG. During S1 on-time, S3 and S2 are also turned on by a slightly-delayed version of the signal driving S1, CS is charged to substantially the voltage of VSIG, and S6 connects amplifier A to VREF. Since A is referred to VREF, both VOUT+ and VOUT− equal VREF at this time. VREF is chosen to be a desirable center voltage for any circuitry to be driven by A.

Slightly before S1 is to be turned off, S2, S3, and S6 are turned off and S4 and S5 are turned on. Since practical embodiments of S1 have a turn-off delay, the effective switching of T6 coincides with the toggling of these other switches. When S1 is turned off, D1 and D2 are turned off by the fly-back of T6. The voltage across CS is now placed in series with Vref and applied to A, causing an amplified replica of VSIG to appear on VOUT+ with respect to VOUT−. It should be noted that new data arrives at VOUT (i.e., (VOUT+)−(VOUT−)) only after a sample is taken by A, so data latency is inherent in FIG. 6. If desired, a sample-hold circuit may be cascaded with VOUT to provide an uninterrupted representation of VSIG, but doing so does not eliminate data latency.

In addition to providing a level-shifter that resets T6 by damped resonance instead of commutation, the circuit of FIG. 6 shows that in various embodiments of the present innovation a high-voltage sampling bridge can be used in place of a prior art sampling frontend to enable a traditional sampling loop, either analog or digital, real-time or equivalent-time, providing high-CMR data-acquisition at high voltages. This capability differs significantly from prior-art samplers which are usually limited to a few volts around zero.

Figure 7:
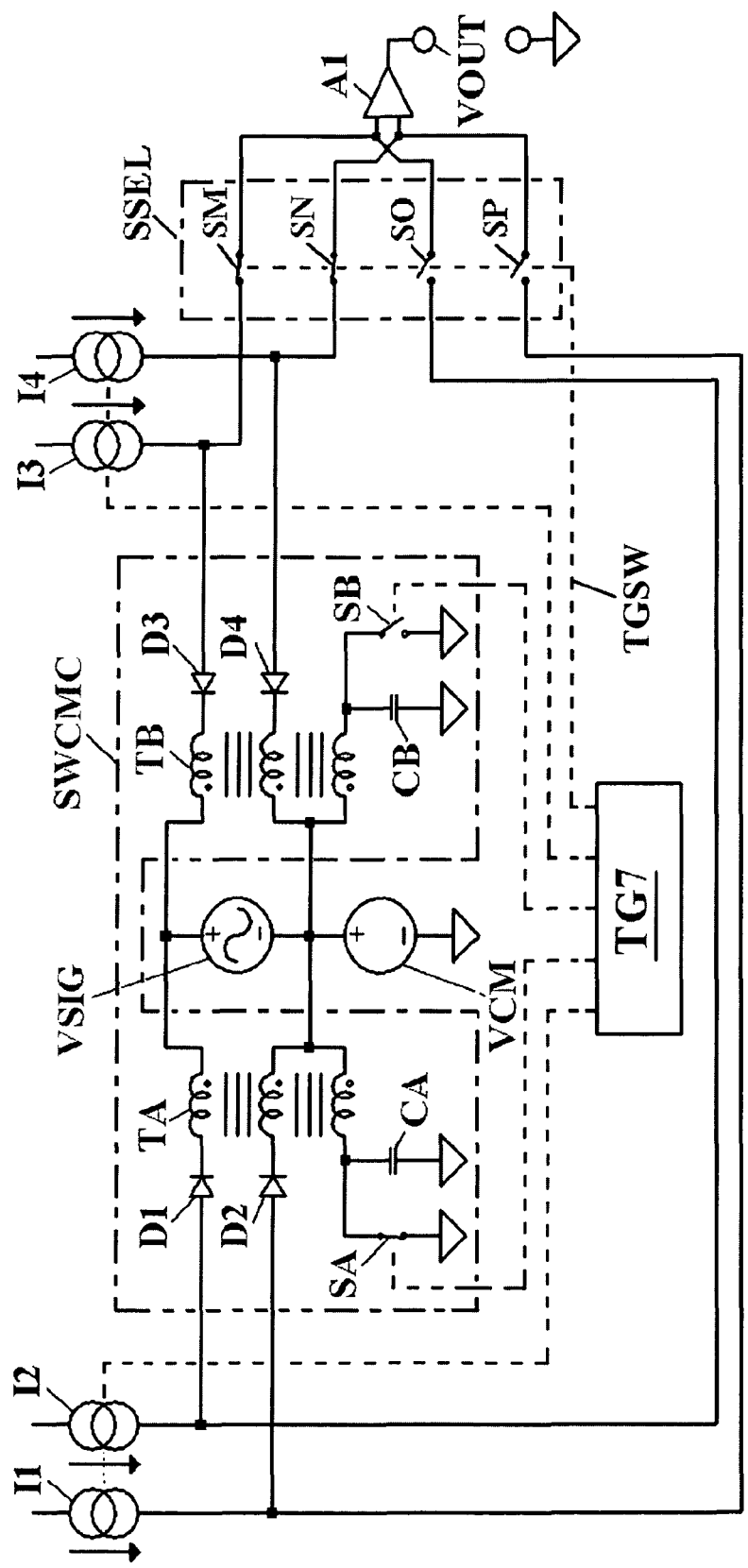
FIG. 7 is a schematic diagram of a dampened resonance common-mode choke in accordance with another embodiment of the present innovation, where the choke of FIG. 7 is an improvement over the choke of FIG. 6.

FIG. 7 shows yet another embodiment of the present innovation, which suffers from neither unruly transient common-mode currents nor from data latency, and thus is an improvement over the embodiment of FIG. 6. A switched common-mode choke block, labeled SWCMC, comprises two three-winding chokes TA and TB with switches SA and SB and two reset capacitors CA and CB, and diodes D1-D4, all organized into more-or-less identical left and right lobes. As should be appreciated, each lobe of SWCMC corresponds to the left-hand portion of FIG. 6. Accompanying each lobe of SWCMC is a pair of current sources, each pair corresponding to I1 and I2 of FIG. 6.

In the circuit of FIG. 7, a logic signal from timing generator TG7 turns ON each current source pair I1, I2 and I3, I4 180 degrees out of phase with the other current source pair, with an overlap of about 10 nS. As may be appreciated, although continuous currents can be used, economy dictates pulsed current sources in the embodiment of FIG. 7. The operations of D1, D2, I1, I2, SA, CA, TA, and those of D3, D4, I3, I4, SB, CB, TB in the presence of VCM and VSIG, correspond to the operations of D1, D2, I1, I2, S1, C, T6 in FIG. 6, save that the on duty-cycles of SA and SB are both approximately 62% rather than 25%, and that SB is operated 180 degrees out of phase with SA. Thus, the conduction times of SA and SB overlap in time.

TA and TB in FIG. 7 are not magnetically coupled, with the result being that the overlap of these switches incurs no "shoot-through" current. Nevertheless, the lobes of SWCMC overlap data to present to SSEL continuous VSIG data. As may be appreciated, SSEL is a DPDT switch comprising four electronic switches, labeled SM, SN, SO, and SP. SSEL operates at about 50% duty-cycle, toggling during the overlap of SA and SB to select data always present at either SM and SN from the right lobe or SO and SP from the left lobe. SSEL is responsive to TGSW, a differential control signal generated in an appropriate manner by TG7. SSEL switches in about a nanosecond if not nearly instantaneously, incurring substantially no data latency.

The differential output of SSEL is an approximately ground-level replica of VSIG, despite the fact that VCM may transition tens of volts in mere tens of nanoseconds. SSEL feeds amplifier A1, a differential to single-ended amplifier of conventional character having broadband common mode rejection. A1 removes small common-mode voltages caused by VCM occasionally transitioning slightly below ground and from the diode-drops of D1-D4. A1 produces the output signal VOUT referred to ground in the circuit of FIG. 7, although VOUT may alternately be referred to a desired reference voltage.

Figure 8:
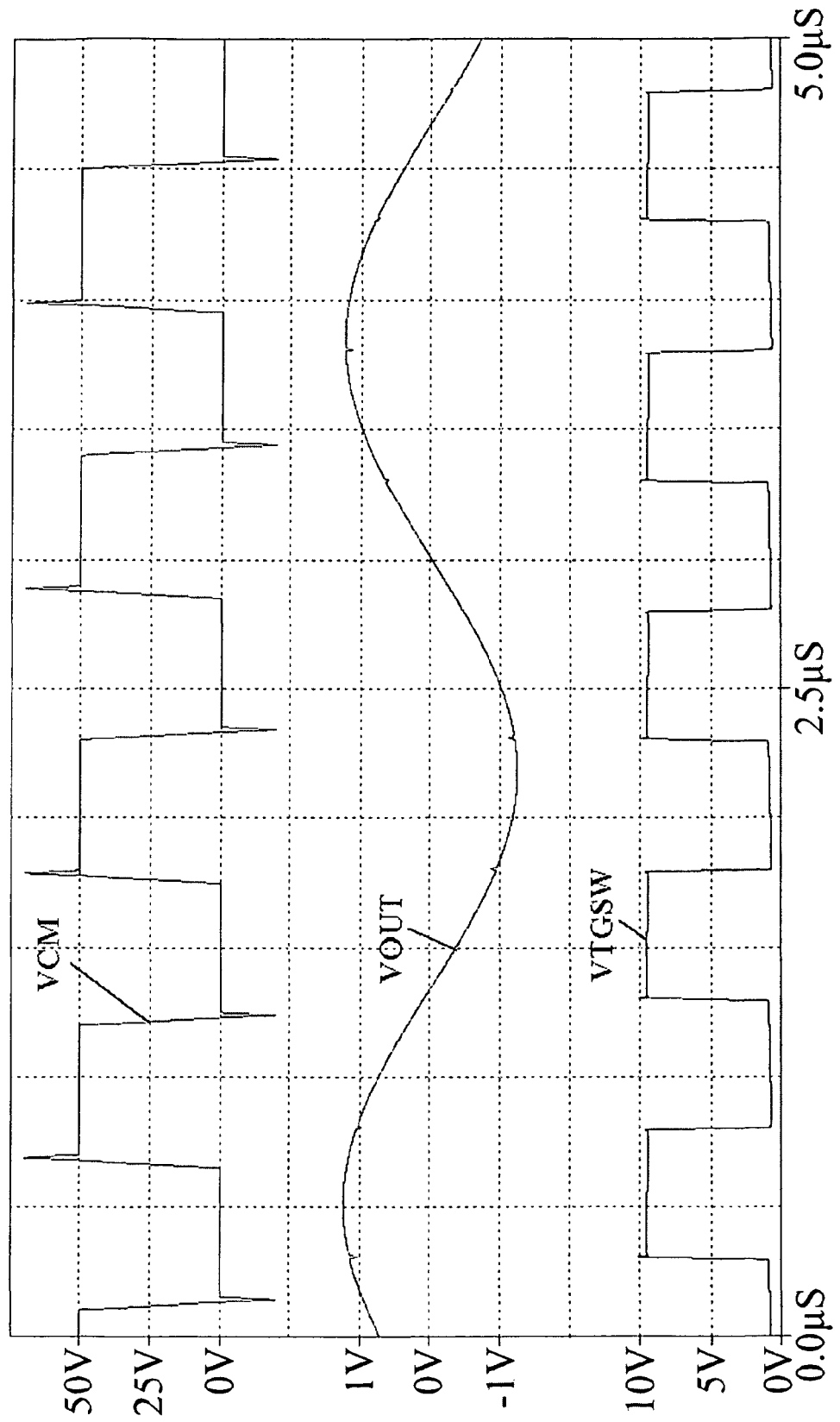
FIGS. 8 and 9 are timing diagrams associated with the choke of FIG. 7.

FIG. 8 shows the waveforms of the circuit of FIG. 7. The VCM trace shows the fast transitions which typically can be encountered. It should be noted that it is difficult to construct a totem-pole to supply such a VCM without incurring tens of nano-Henries of stray inductance. Energy stored in such inductance creates the undesirable spikes shown on VCM. The VOUT trace shown is for an input VSIG of 50 mV peak at 300 kHz. It should be noted that the tiny spikes on VOUT are not time-related to the transitions of VCM. The circuit has about 120 dB of common-mode rejection, even at high-frequencies. Further examination of the tiny spikes shows that they are time-related to TGSW. The control voltage at TGSW is shown in the lower trace as VTGSW, and is seen to operate at 1 MHz. Moreover, the spikes are most evident near the peaks of VOUT, because they are not carrier feed-through from TGSW, but tiny transient gain errors that occur during the toggling of SSEL of FIG. 7.

Figure 9:
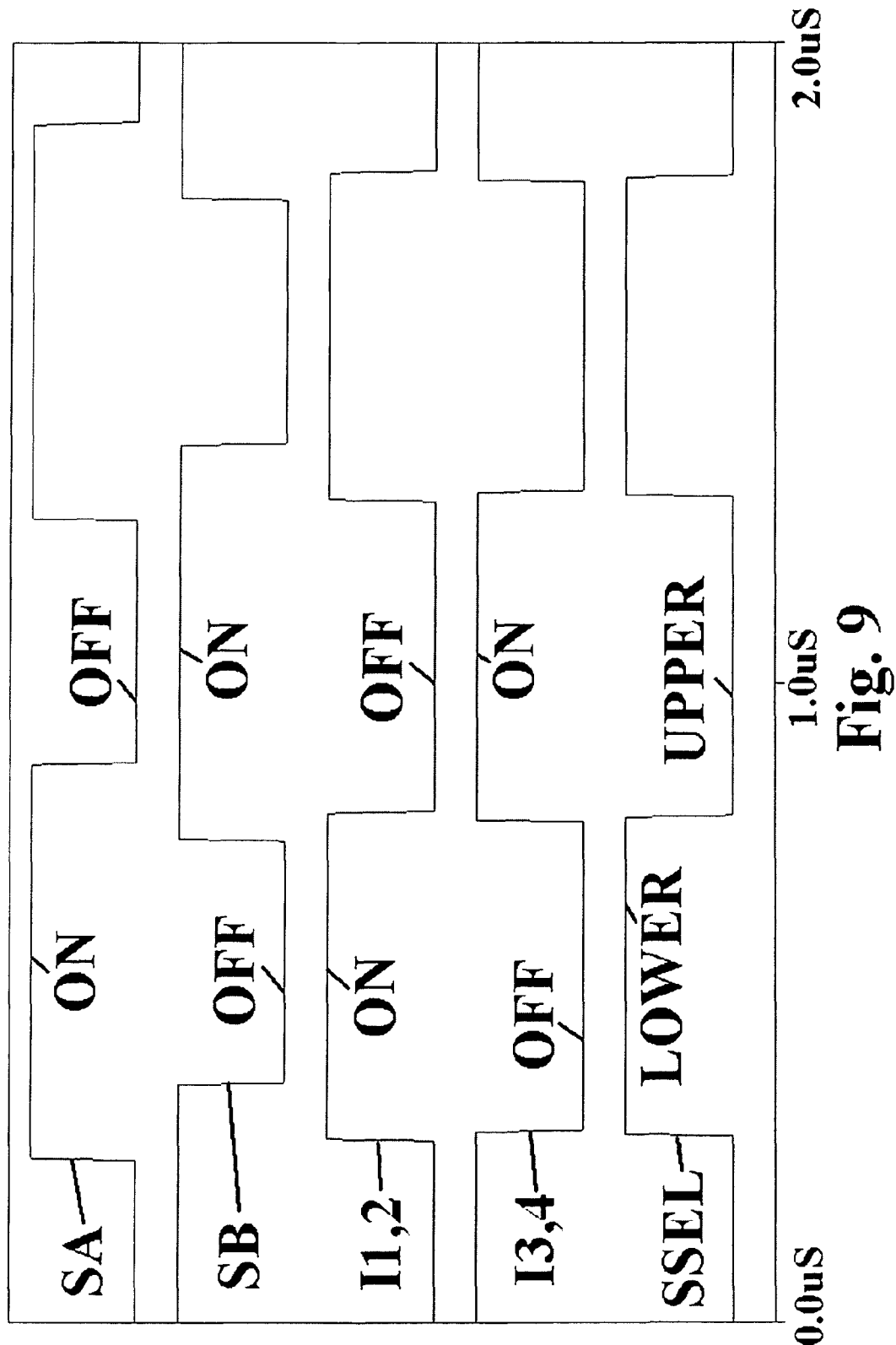

FIG. 9 shows other timing waveforms provided by TG7 of FIG. 7. In particular, FIG. 9 shows that the switching signals applied to SA (left lobe) and SB (right lobe) in FIG. 7 overlap. As was set forth above and as shown, the on duty-cycles of SA and SB are both approximately 62%, and SB is operated 180 degrees out of phase with SA. Thus, at no point are both SA and SB off. Similarly, FIG. 9 shows that the switching signals applied to I1, I2 (left lobe) and I3, I4 (right lobe) in FIG. 7 overlap. Here, though, the on duty-cycles are both approximately 52%, with a 180 degree phase shift therebetween. Thus, and likewise, at no point are both I1, I2 and I3, I4 off. Moreover, it can be seen that SSEL selection changes while both SA and SB are on and while both I1, I2 and I3, I4 are on. The 1 MHz operating frequency of all signals from TG7 should be evident in FIG. 9.

Figure 10:
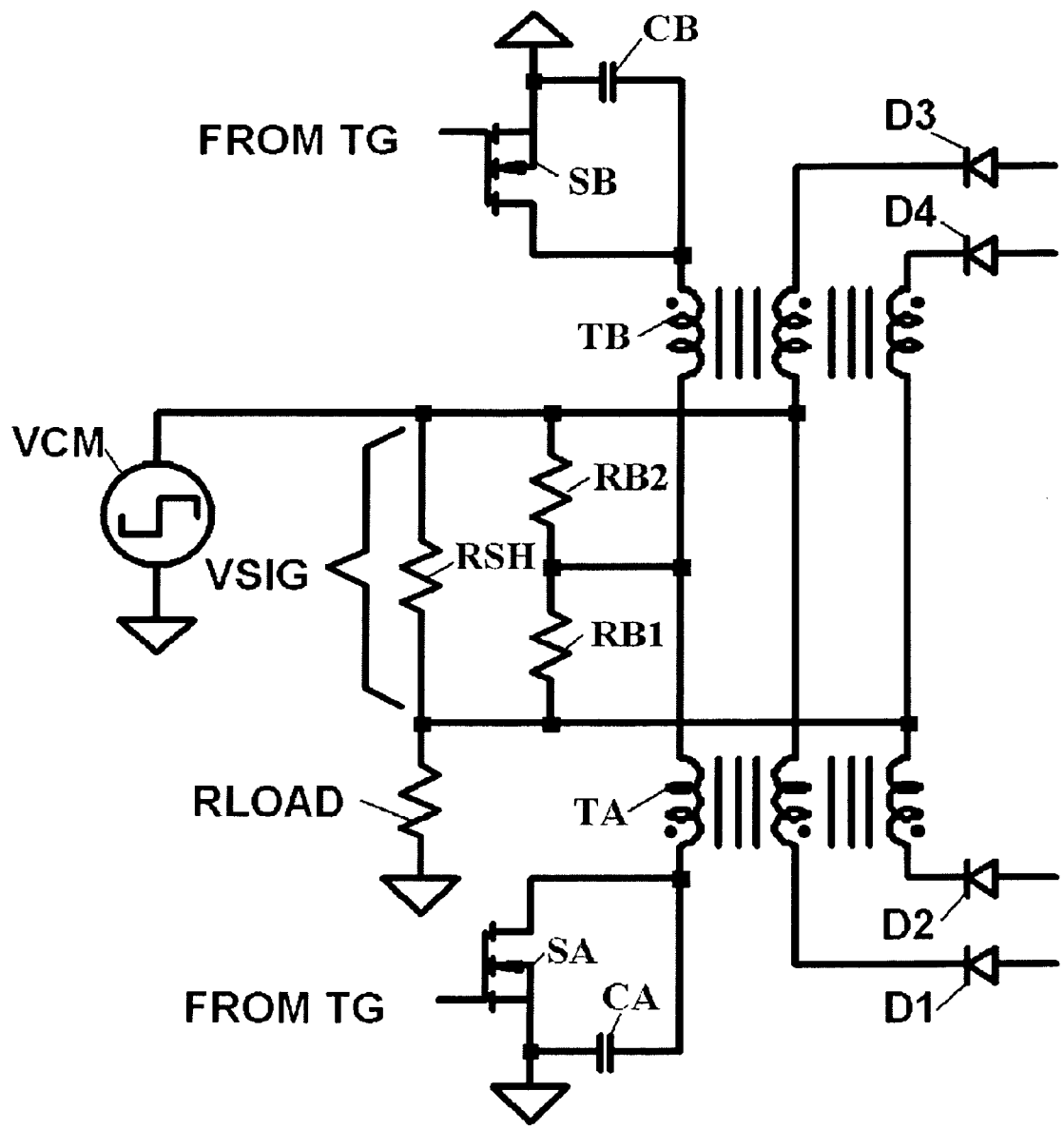
FIGS. 10-13 are schematic diagrams of portions of working embodiments of the choke of FIG. 7 in accordance with embodiments of the present innovation.

FIG. 10 shows an excerpt from a working embodiment of the choke of FIG. 7, and displays details of the switched common-mode choke SWCMC and associated components for application in a measurement environment. VCM is a power-conversion totem-pole toggling between about 0V and about 50V with about 25 nS transitions, driving a peak current of about 50 amperes through load RLOAD, about 1 ohm, and through a shunt resistor RSH, which may be about 1 milliohm. As should be appreciated, care should be exercised to reduce the frequency-dependent impedance of RSH. VSIG is developed across RSH having a peak amplitude of about 50 mV. RB1 and RB2, which may be about 1 ohm, are balancing resistors, through which the magnetizing currents of the primaries of TA and TB are drawn. SA and SB are N-channel MOSFETs, such as for example Supertex type TN2524. CA and CB resonate with TA and TB respectively to reset the latter during the OFF times of their respective switches SA and SB. TA and TB may be wound on TDK cores, type PC95ELT13/04.4Z to obtain an inductance of about 250 uH. D1 through D4 may be type BAS21. The 5V logic-level signals from TG7 (TG in FIG. 10) drive SA and SB with the timings shown in FIG. 9.

Figure 11:
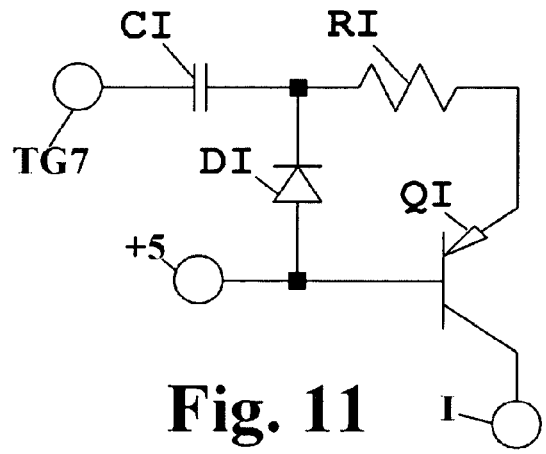

FIG. 11 also shows an excerpt from a working embodiment of the choke of FIG. 7, and displays one pulsed current source represented in FIG. 7 by I1, I2, I3 or I4. A logic signal from TG7 typically toggles between zero and about +5 volts. When the logic signal is at zero, capacitor CI, which may be about 47 nF, charges nearly to 5V through diode DI, which may be ON Semiconductor type RB751S40, from a typical 5V power supply attached to the node labeled +5. When the logic signal transitions to +5 volts, the voltage across CI cannot instantaneously change, so about +9.7 volts is applied to RI. The other terminal of RI connects to the emitter of transistor QI, which may be type MMBTH81, and the emitter rises to about +5.6 volts. Thus, a voltage difference of about 4.1 volts across RI causes a current, which may be about 4 mA if RI is 1 kiloohm, to flow into the emitter of QI. Most of such current exits the collector of QI collector through the node labeled I and then to the anode of a diode such as D1-D4 in FIG. 7.

Figure 12:
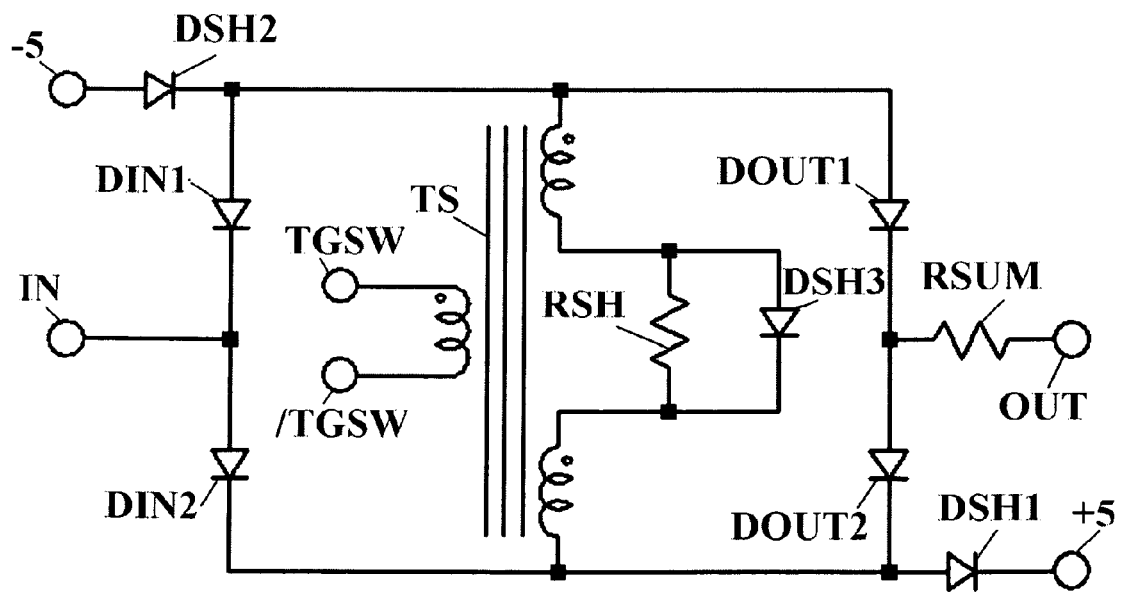

FIG. 12 also shows an excerpt from a working embodiment of the choke of FIG. 7, and displays one of the four switches labeled SM-SP in FIG. 7. Transformer TS of FIG. 12 may have a primary of about 155 micro-Henries driven by a 10V p-p differential signal from TG7 of FIG. 7, applied thereto through nodes TGSW and /TGSW. TS actually has as many secondaries as are needed to drive all the switches of SSEL of FIG. 7, of which two such secondaries are shown in FIG. 12. The secondaries may be about 240 micro-Henries. The core of TS may be a TDK type PC95ELT13/04.4Z, among others. The applied drive toggles as shown in accordance with the signal SSEL in FIG. 9.

When TGSW is positive at the primary, the dotted terminal of each secondary of TS is also positive. As seen, current then flows in two branches from the two shown secondaries of FIG. 12, one branch through diodes DIN1 and DIN2, and another through diodes DOUT1 and DOUT2. The total current in the two branches is set by resistor RSH, which may be about 3 kilo-ohms. Diodes DIN1, DIN2, DOUT1, and DOUT2 may all be ON Semiconductor type RB751S40, among others. Since the diode drops of such diodes tend to cancel, the voltage at the node labeled IN is applied to the junction of DOUT1, DOUT2, and RSUM. RSUM is connected through the node labeled OUT to another similar switch section of SSEL as is shown FIG. 7. During the overlap of SA and SB (see FIG. 9), the voltage at the node formed by thus connecting nodes OUT of two switch sections tends to be the average of the representation of one pole of VSIG in the two lobes of FIG. 7.

When the polarity of TGSW reverses, DIN1, DIN2, DOUT1 and DOUT2 all turn off, and diodes DSH1, DSH2 and DSH3 all turn on. Current then flows from the node labeled +5, connected to a typical +5V power supply, through all three DSH diodes and through both secondaries of TS to the node labeled −5, connected to a typical −5V power supply. Since both +5 and −5 are AC grounds, DSH1 and DSH2 are on, and DIN1, DIN2, DOUT1 and DOUT2 are all off, the aforementioned diodes form a series-shunt switch having high attenuation in the off state. As should be appreciated, in SSEL of FIG. 7, SM and SN operate 180 degrees out of phase with SO and SP. Inversion may be accomplished simply by reversing the polarity of all secondaries of TS driving SO and SP with respect to the polarities of corresponding secondaries driving SM and SN.

Figure 13:
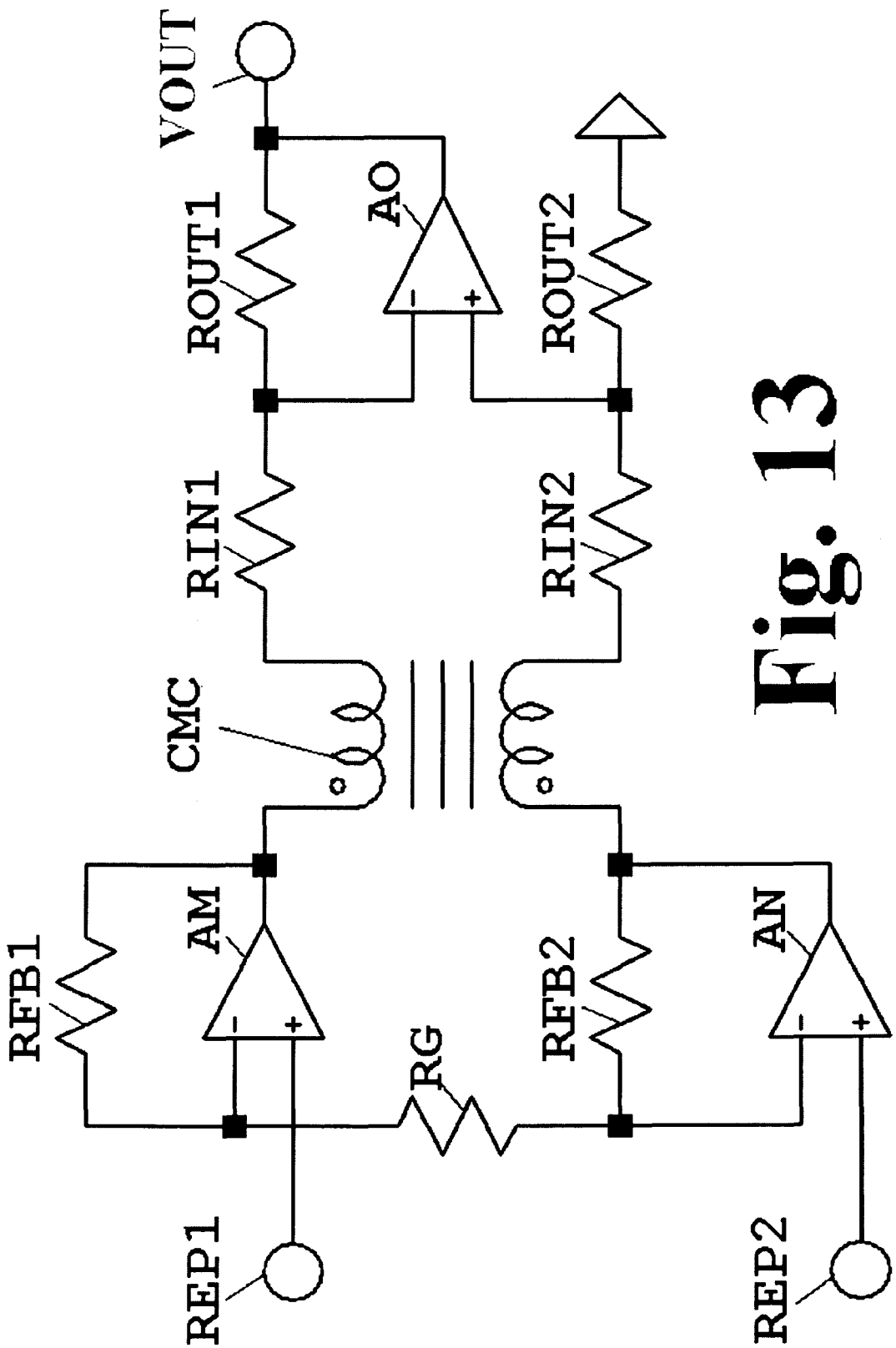

FIG. 13 also shows an excerpt from a working embodiment of the choke of FIG. 7, and displays a differential to single-ended amplifier corresponding to A1 of FIG. 7. As may be appreciated, the differential output of SSEL of FIG. 7 is applied to the nodes labeled REP1 and REP2. Amplifiers AM and AN, which may both be obtained from the dual op-amp National Semiconductor type LMH6724 among others, respectively feed back current through resistors RFB1 and RFB2, each of which may be about 1 kilo-ohm, to cause the voltages at the two terminals of resistor RG, which may be about 499 ohms, to match the respective REP1 and REP2 nodes of the amplifier to which they are connected. As may be appreciated, then, the voltage between the outputs of AM and AN is about 5 times that between REP1 and REP2.

Common-mode choke CMC, which may be about 100 micro-henries and of ordinary character, impedes high frequency common-mode voltages from flowing in resistors RIN1 and RIN2, each of which may be about 300 ohms. The voltage between the outputs of AM and AN thus passes unimpeded through choke CMC and appears between the respective junctions of CMC with RIN1 and RIN2. Amplifier AO is coupled at its inputs terminals to the opposite sides of RIN1 and RIN2, as seen, and responds to null the voltage between such input terminals through ROUT1 and ROUT2, both about 1.5 kilo-ohms, by driving the node labeled VOUT to a voltage with respect to ground about 5 times the voltage between the outputs of AM and AN, and by extension about 25 times the voltage exiting SSEL of FIG. 7, which is also about 25 times VSIG.

CONCLUSION

As may be appreciated, although the present innovation is disclosed particularly with regard to a unipolar VCM, the innovation may also be practiced to accommodate a bi-polar VCM by installing bi-directionally blocking switches and dual diode sets with appropriate drive and biasing in place of diodes D1-D4 of FIG. 7 Also, the level-shifter of the present innovation may be implemented with other types of switching elements including MOSFETs, BJT's, thyristors, IGBTs, magnetic amplifiers, and the like. Further, though deliberate control of resonance is practiced with regard to the circuitry shown in FIGS. 6 and 7, it is practical to allow parasitic circuit elements to dominate the resonant frequency and damp the inductive reactor.

Moreover, although the embodiments of the present innovation as set forth above and/or shown in the drawings include dedicated switches and dedicated chopping-frequency sources, the innovation can also be practiced by using pre-existing switches and chopping signals commonly found in prior art power converters to drive a common-mode inductive reactor in the manner disclosed herein. In addition, it should be noted that in unipolar VCM applications, effective commutation may be obtained not only by the use of controlled switches but also by the use of diodes clamping inductive fly-back. Also, it should be understood that a common-mode choke such as is employed in connection with the present innovation is inherently a differential device, even if one side is grounded, as is the case with the circuit shown in FIG. 2.

In the present innovation, a method and mechanism are provided to avoid saturating a common-mode choke core when a DC common-mode voltage is applied thereto. A common-mode level shifter can shift wideband DC differential signals across large AC or DC common-mode voltage differences with exceptional fidelity, even in the presence of common-mode transients, and a sampling bridge faithfully acquires signals in the presence of severe common-mode disturbances.

It should be appreciated that changes could be made to the embodiments described above without departing from the innovative concepts thereof. It should be understood, therefore, that this innovation is not limited to the particular embodiments disclosed, but it is intended to cover modifications within the spirit and scope of the present innovation as defined by the appended claims.

The invention claimed is:

1. A switched-mode level-shifter for shifting a differential voltage superimposed on a common-mode voltage, the level-shifter comprising:
a common-mode inductive reactor having at least two windings, and configured such that at least one of the differential voltage and the common-mode voltage is applied to at least one of the windings of the reactor;
a source of a chopping signal; and
switch circuitry connected to the inductive reactor, responsive to a first state of the chopping signal for charging the inductive reactor with flux according to a voltage applied to the inductive reactor, and configured to reset flux in the inductive reactor during a second state of the chopping signal.

2. The level-shifter of claim 1, wherein said switch circuitry comprises a MOSFET, a BJT, a thyristor, an IGBT, and a magnetic amplifier.

3. The level-shifter of claim 1, wherein said switch circuitry is unipolar blocking.

4. The level-shifter of claim 1, wherein said switch circuitry is bipolar blocking.

5. The level-shifter of claim 1, wherein said switch circuitry is also used as a power switch for power-conversion.

6. The level-shifter of claim 1, wherein the switch circuitry is a resonant circuit.

7. The level-shifter of claim 1, wherein the inductive reactor is reset by commutative switching.

8. The level-shifter of claim 7, wherein reset voltage is clamped by a diode.

9. The level-shifter of claim 1, wherein at least part of the circuit of the current in the switch circuitry enabling reset of the inductive reactor is shared with the circuit of the current providing the level-shifter output.

10. The level shifter of claim 1, wherein no part of the circuit conducting current in the switch circuitry enabling reset of the inductive reactor is shared with the circuit of the current providing the level-shifter output.

11. The level-shifter of claim 1, wherein any resonance is one of (i) set by parasitic reactive quantities and (ii) damped by parasitic losses.

12. The level-shifter of claim 1, wherein the reset of the inductive reactor is effectuated by directing current generated by collapse of the experienced flux during the reset through a resonating capacitance.

13. The level-shifter of claim 1, wherein the reset of the inductive reactor is effectuated by directing current generated by reversal of the experienced flux during the reset to a voltage source poled to reverse the experienced flux.

14. The level-shifter of claim 1, wherein:
the switch circuitry is configured to charge the inductive reactor when the switch circuitry is caused to be in the first state, the inductive reactor when charged experiencing a change of flux according to the applied voltage, the switch circuitry also actuating a reset of the charged inductive reactor when the switch circuitry is caused to be in the second state, the inductive reactor when reset reversing the change of flux experienced thereby; and
the source of the chopping signal is configured to alternately drive said switch circuitry between the first and second states, each of the first and second states being one of in and out of conduction.

15. The level-shifter of claim 1, wherein:
the inductive reactor is a first inductive reactor of the level-shifter;
the switch circuitry is first switch circuitry of the level-shifter; and
the level-shifter further comprises:
a second common-mode inductive reactor;
second switch circuitry connected to the second inductive reactor:
the first and second common-mode inductive reactors, each having at least two windings, at least one of the differential voltage and the common-mode voltage being applied to at least one of the windings of each reactor;
in the first state of the chopping signal, (i) the first switch circuitry causes the first inductive reactor to be charged with flux according to voltage applied to the first inductive reactor and (ii) the second switch circuitry causes flux to be reset in the second inductive reactor; and in the second state of the chopping signal, (i) the second switch circuitry causes the second inductive reactor to be charged with flux according to voltage applied to the second inductive reactor and (ii) the first switch circuitry causes flux to be reset in the first inductive reactor; and an output selector alternately selecting an output of each of the first and second inductive reactors.

16. The level shifter of claim 15, wherein the source of the chopping signal generally drives each of the first and second switch circuitries into and out of conduction about 180 degrees out of phase with each other.

* * * * *